United States Patent
Ko et al.

(10) Patent No.: US 11,594,656 B2
(45) Date of Patent: Feb. 28, 2023

(54) QUANTUM LIGHT SOURCE DEVICE AND OPTICAL COMMUNICATION APPARATUS INCLUDING THE SAME

(71) Applicant: Electronics and Telecommunications Research Institute, Daejeon (KR)

(72) Inventors: Young-Ho Ko, Daejeon (KR); Kap-Joong Kim, Daejeon (KR); Byung-seok Choi, Sejong-si (KR); Won Seok Han, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 358 days.

(21) Appl. No.: 17/075,966

(22) Filed: Oct. 21, 2020

(65) Prior Publication Data

US 2021/0119076 A1   Apr. 22, 2021

(30) Foreign Application Priority Data

Oct. 21, 2019 (KR) .......... 10-2019-0130965
Oct. 5, 2020  (KR) .......... 10-2020-0128036

(51) Int. Cl.

| H01L 33/06 | (2010.01) |
|---|---|
| H01L 33/40 | (2010.01) |
| H01L 33/10 | (2010.01) |
| H01L 33/30 | (2010.01) |
| H01L 33/00 | (2010.01) |
| H01L 25/075 | (2006.01) |

(52) U.S. Cl.
CPC .......... *H01L 33/06* (2013.01); *H01L 25/0756* (2013.01); *H01L 33/002* (2013.01); *H01L 33/10* (2013.01); *H01L 33/305* (2013.01); *H01L 33/405* (2013.01); *H01L 2933/0016* (2013.01)

(58) Field of Classification Search
CPC ..... H01L 33/0025; H01L 33/06; H01L 33/10; H01L 33/32; H01L 33/405
See application file for complete search history.

(56) References Cited

U.S. PATENT DOCUMENTS

| 7,864,824 B2 | 1/2011 | Park et al. |
| 8,320,763 B2 | 11/2012 | Kim et al. |
| 9,705,282 B2 | 7/2017 | Takabayashi et al. |
| 10,586,887 B2 | 3/2020 | Cho et al. |
| 2011/0090932 A1* | 4/2011 | Park .................. H01S 5/06258 372/96 |

(Continued)

FOREIGN PATENT DOCUMENTS

| KR | 10-1921825 | 11/2018 |
| KR | 10-1940748 | 1/2019 |
| KR | 10-2019-0116299 | 10/2019 |

*Primary Examiner* — Mark W Tornow
(74) *Attorney, Agent, or Firm* — Kile Park Reed & Houtteman PLLC (57) ABSTRACT

Disclosed are a quantum light source and an optical communication apparatus including the same. The quantum light source device includes a vertical reflection layer disposed on a substrate, a lower electrode layer disposed on the vertical reflection layer, a horizontal reflection layer disposed on the lower electrode layer, a quantum light source disposed in the horizontal reflection layer, and an upper electrode layer disposed on the horizontal reflection layer.

16 Claims, 9 Drawing Sheets

(56) References Cited

U.S. PATENT DOCUMENTS

2012/0051386 A1* 3/2012 Kim .................... H01S 5/06258
372/96
2020/0279972 A1 9/2020 Alén Millán et al.

* cited by examiner

QUANTUM LIGHT SOURCE DEVICE AND OPTICAL COMMUNICATION APPARATUS INCLUDING THE SAME

CROSS-REFERENCE TO RELATED APPLICATIONS

This U.S. non-provisional patent application claims priority under 35 U.S.C. § 119 of Korean Patent Application Nos. 10-2019-0130965, filed on Oct. 21, 2019, and 10-2020-0128036, filed on Oct. 5, 2020, the entire contents of which are hereby incorporated by reference.

BACKGROUND

The present disclosure herein relates to an optical communication apparatus, and more particularly, to a quantum light source device and an optical communication apparatus including the same.

In general, a light emittable material having a single photon light source or an entangled light source may include a semiconductor quantum dot, silicon carbide (SiC), inter-dot coupling of diamond, and inter-dot coupling of a two-dimensional material. The above-described materials may generate a quantum light source therein. However, an optical wavelength or a position distribution of the dot coupling may not be constant, and light thereof may be hardly controlled. The light generated from the dot light source may be emitted to all directions (e.g., 360° directions) of a sphere shape to decrease an optical extraction efficiency.

SUMMARY

The present disclosure provides a quantum light source device capable of increasing a light extraction efficiency and an optical communication apparatus including the same.

An embodiment of the inventive concept provides a quantum light source device including: a vertical reflection layer disposed on a substrate; a lower electrode layer disposed on the vertical reflection layer; a horizontal reflection layer disposed on the lower electrode layer; a quantum light source disposed in the horizontal reflection layer; and an upper electrode layer disposed on the horizontal reflection layer. Here, the horizontal reflection layer includes: a central portion in which the quantum light source is disposed; and a plurality of ring portions that surround an outer portion of the central portion.

In an embodiment, the plurality of ring portions may be spaced apart from the central portion by an air gap.

In an embodiment, the quantum light source may be disposed at a relative height that is about 40% of a thickness of the horizontal reflection layer.

In an embodiment, when the thickness of the horizontal reflection layer is about 125 nm, the quantum light source may be disposed at a height of about 50 nm from a bottom surface of the horizontal reflection layer.

In an embodiment, the lower electrode layer may include: a first arc electrode disposed at an outermost portion of the ring portions; and a first rod electrode connected to the first arc electrode and disposed at one side of the central portion and the ring portions.

In an embodiment, the upper electrode layer may include: a second arc electrode disposed at an outermost portion of the ring portions; and a second rod electrode connected to the second arc electrode and disposed at the other side of the central portion and the ring portions.

In an embodiment, each of the central portion and the plurality of ring portions may include: a first doped layer having a first conductive-type; an intrinsic layer disposed on the first doped layer; and a second doped layer disposed on the intrinsic layer and having a second conductive-type that is different from the first conductive-type.

In an embodiment, the quantum light source may be disposed in the intrinsic layer of the central portion.

In an embodiment, the horizontal reflection layer may include gallium arsenide (GaAs) or indium phosphide (InP).

In an embodiment, the quantum light source may include indium arsenide (InAs).

In an embodiment, the vertical reflection layer may include: first dielectric layers; and second dielectric layers that are laminated alternately with the first dielectric layers.

In an embodiment, the quantum light source device may further include a reflection optimization layer disposed between the vertical reflection layer and the horizontal reflection layer.

In an embodiment, the reflection optimization layer may include silicon oxide.

In an embodiment of the inventive concept, an optical communication apparatus includes: a quantum light source device; and an optical fiber bonded to the quantum light source device. Here, the quantum light source device includes: a vertical reflection layer disposed on a substrate; a lower electrode layer disposed on the vertical reflection layer; a horizontal reflection layer disposed on the lower electrode layer; a quantum light source disposed in a center of the horizontal reflection layer; and an upper electrode layer disposed on the horizontal reflection layer. Also, the horizontal reflection layer includes: a central portion in which the quantum light source is disposed; and a plurality of ring portions that surround an outer portion of the central portion.

In an embodiment, the optical communication apparatus may further include an optical circuit including an optical waveguide disposed between the optical fiber and the horizontal reflection layer.

In an embodiment, the optical waveguide may be aligned to the central portion.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, preferred embodiments of the inventive concept will be described in detail with reference to the accompanying drawings. Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout.

In the following description, the technical terms are used only for explaining a specific exemplary embodiment while not limiting the present disclosure. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components. Since preferred embodiments are provided below, the order of the reference numerals given in the description is not limited thereto.

Additionally, the embodiment in the detailed description will be described with sectional views as ideal exemplary views of the present invention. Also, in the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes.

Figure 1:
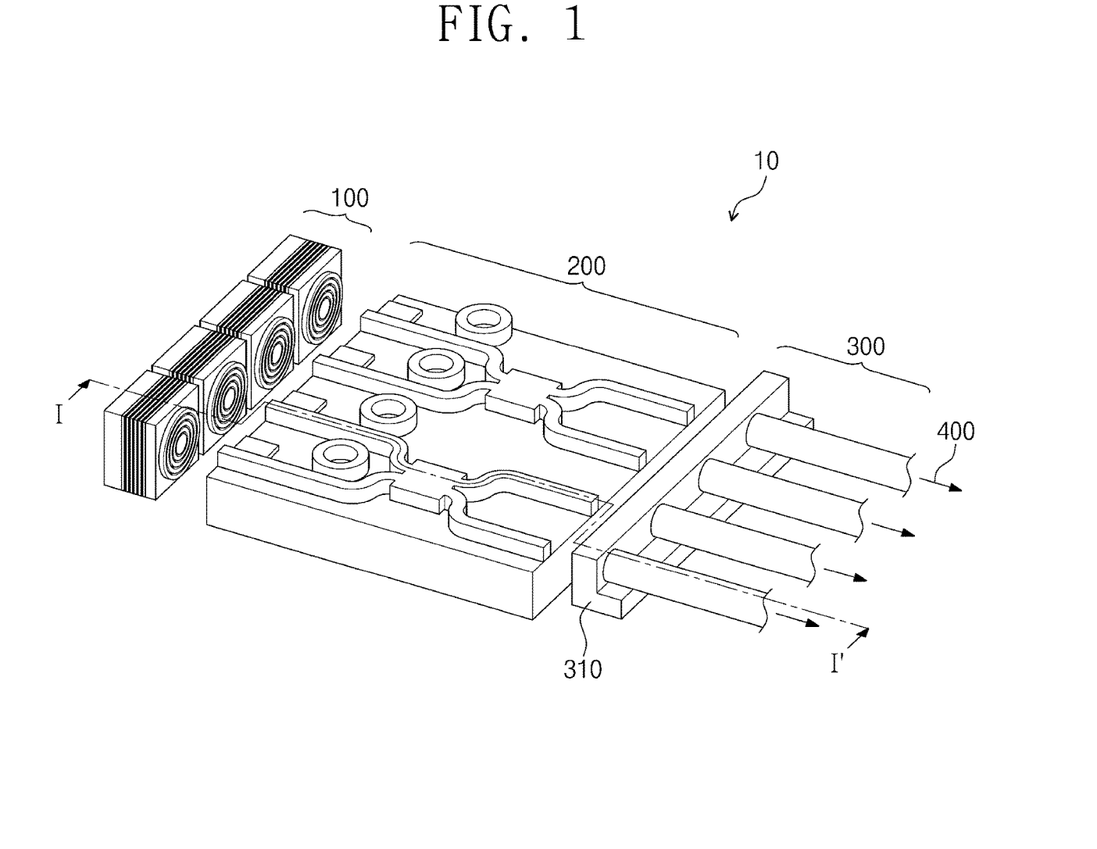
FIG. 1 is a view illustrating an example of an optical communication apparatus 10 according to an embodiment of the inventive concept.

FIG. 1 is a view illustrating an example of an optical communication apparatus 10 according to an embodiment of the inventive concept.

Referring to FIG. 1, the optical communication apparatus 10 according to an embodiment of the inventive concept may be a multi-channel optical communication apparatus 10. For example, the optical communication apparatus 10 may include quantum light source devices 100, an optical circuit 200, and optical fibers 300. The quantum light source devices 100 may generate light 400. The light 400 may be realized in multi-channels according to generated wavelengths. The optical circuit 200 may modulate the light 400. The optical fibers 300 may output the light 400 to the outside.

Figure 2:
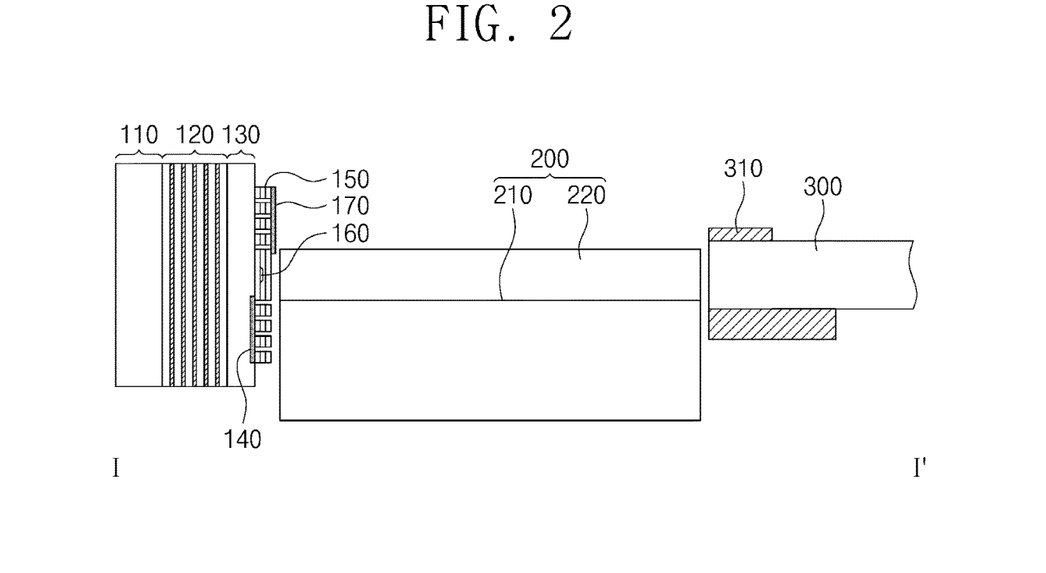
FIG. 2 is a cross-sectional view taken along line I-I' of FIG. 1.

FIG. 2 is a cross-sectional view taken along line I-I' of FIG. 1.

Referring to FIGS. 1 and 2, the quantum light source devices 100 may be disposed at one side of the optical circuit 200. For example, each of the quantum light source devices 100 may include a light source substrate 110, a vertical reflection layer 120, a reflection optimization layer 130, a lower electrode layer 140, a horizontal reflection layer 150, a quantum light source 160, and an upper electrode layer 170.

The light source substrate 110 may include glass, quartz, silicon (Si), gallium arsenide (GaAs), indium phosphide (InP), and aluminum oxide ($Al_2O_3$).

The vertical reflection layer 120 may be disposed on the light source substrate 110. The vertical reflection layer 120 may reflect the light 400 in a direction perpendicular to the light source substrate 110. That is, the vertical reflection layer 120 may be a rear reflection layer with respect to the light 400 of the quantum light source 160. For example, the vertical reflection layer 120 may be a distributed Bragg mirror (DBR) or a metal (Au, Ag, Pt, Al, etc.) thin-film. For example, the vertical reflection layer 120 may include first dielectric layers 122 and second dielectric layers 124.

The first dielectric layers 122 and the second dielectric layers 124 may be alternately laminated. Each of the first dielectric layers 122 and the second dielectric layers 124 may have a thickness of about 5 nm to about 10 nm. Each of the first dielectric layers 122 and the second dielectric layers 124 may include one of silicon oxide ($SiO_2$), silicon nitride ($SiN_x$), and titanium oxide ($TiO_2$).

The second dielectric layers 124 may include a material different from that of the first dielectric layers 122. When each of the first dielectric layers 122 includes the silicon oxide ($SiO_2$), each of the second dielectric layers 124 may include the silicon nitride ($SiN_x$) or the titanium oxide ($TiO_2$). When the first dielectric layer 122 includes the silicon nitride ($SiN_x$) or the titanium oxide ($TiO_2$), the second dielectric layer 124 may include the silicon oxide ($SiO_2$).

The reflection optimization layer 130 may be disposed on the vertical reflection layer 120. The reflection optimization layer 130 may increase reflectance of the vertical reflection layer 120. For example, the reflection optimization layer 130 may include silicon oxide ($SiO_2$). The reflection optimization layer 130 may have a thickness greater than that of each of the first dielectric layer 122 and the second dielectric layer 124. For example, the reflection optimization layer 130 may have a thickness of about 100 nm to about 1000 nm.

Figure 3:
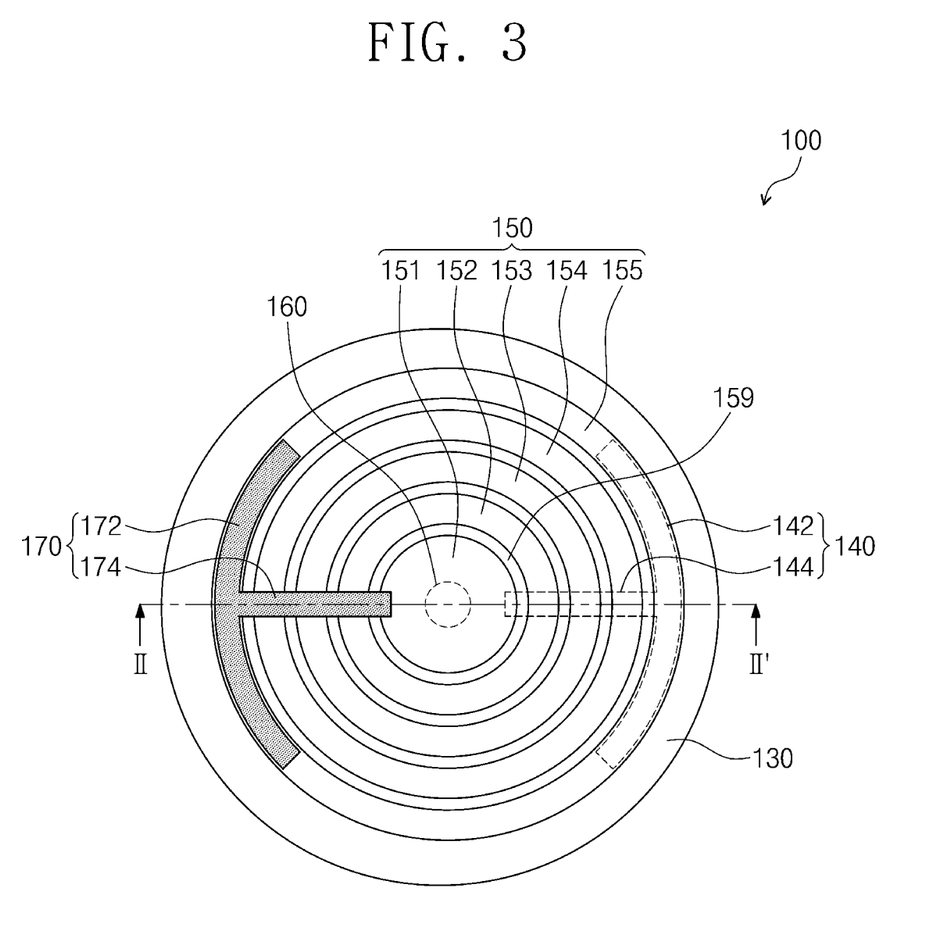
FIG. 3 is a plan view illustrating an example of a lower electrode layer, a horizontal reflection layer, a quantum light source, and an upper electrode layer of FIG. 2.
Figure 4:
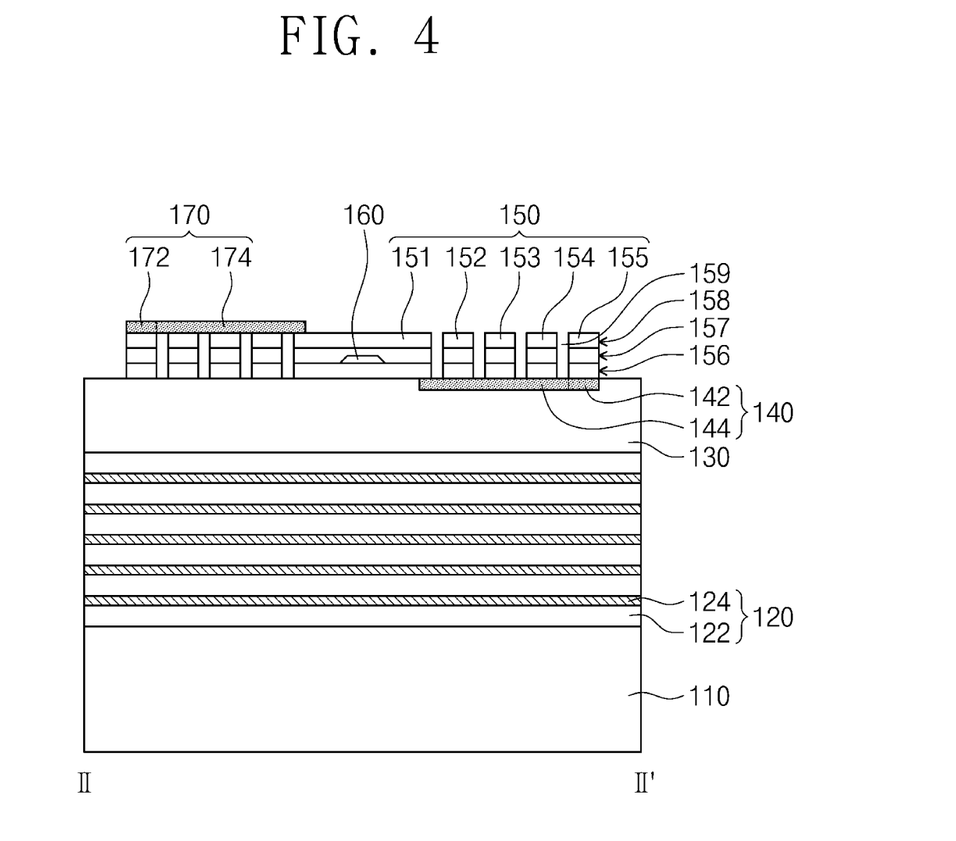
FIG. 4 is a cross-sectional view taken along line I-I' of FIG. 3.

FIG. 3 is a view illustrating an example of the lower electrode layer 140, the horizontal reflection layer 150, the quantum light source 160, and the upper electrode layer 170 of FIG. 2. FIG. 4 is a cross-sectional view taken along line I-I' of FIG. 3.

Referring to FIGS. 3 and 4, the lower electrode layer 140 may be disposed on one side of the reflection optimization layer 130. For example, the lower electrode layer 140 may include metal such as gold (Au), silver (Ag), aluminum (Al), tungsten (W), titanium (Ti), tantalum (Ta), manganese (Mg), and cobalt (Co). For example, the lower electrode layer 140 may include a first arc electrode 142 and a first rod electrode 144. The first arc electrode 142 may be disposed on the one side of the reflection optimization layer 130. The first arc electrode 142 may be connected to the first rod electrode 144. The first rod electrode 144 may extend in a direction toward a center of the reflection optimization layer 130.

The horizontal reflection layer 150 may be disposed on the lower electrode layer 140 and the reflection optimization layer 130. The horizontal reflection layer 150 may reflect the light 400 of the quantum light source 160 in a direction parallel to the light source substrate 110. The horizontal reflection layer 150 may be a side reflection layer with respect to the light 400 of the quantum light source 160. For example, the horizontal reflection layer 150 may include GaAs or InP. For example, the horizontal reflection layer 150 may include a central portion 151 and first to fourth ring portions 152, 153, 154, and 155. The central portion 151 may be disposed on a center of the vertical reflection layer 120. The central portion 151 may have a shape of a disc or a dish.

Referring to FIG. 3, the first to fourth ring portions 152, 153, 154, and 155 may surround the central portion 151. The first to fourth ring portions 152, 153, 154, and 155 may each have a concentric circle shape and be arranged outside the central portion 151. The first ring portion 152 may be spaced apart from the central portion 151 by an air gap 159. The first ring portion 152 may be disposed between the central portion 151 and the second ring portion 153. The second ring portion 153 may be disposed between the first ring portion 152 and the third ring portion 154. The third ring portion 154 may be disposed between the second ring portion 153 and the fourth ring portion 155. The fourth ring portion 155 may surround the third ring portion 154. The first to fourth ring portions 152, 153, 154, and 155 and the air gaps 159 therebetween may have a difference in refractive index. The difference of refractive indexes of the first to fourth ring portions 152, 153, 154, and 155 and the air gaps 159 may increase a reflection efficiency of the light 400.

Referring to FIG. 4, each of the central portion 151 and the first to fourth ring portions 152, 153, 154, and 155 may include a first doped layer 156, an intrinsic layer 157, and a second doped layer 158. The first doped layer 156 may has a first conductivity (e.g., an n-type). The intrinsic layer 157 may be disposed on the first doped layer 156. The second doped layer 158 may be disposed on the intrinsic layer 157. The second doped layer 158 may has a second conductivity (e.g., a p-type).

The quantum light source 160 may be disposed in the intrinsic layer 157 of the central portion 151. For example, the quantum light source 160 may include indium arsenide (InAs). When a source power is supplied to the lower electrode layer 140 and the upper electrode layer 170, the quantum light source 160 may generate the light 400.

The upper electrode layer 170 may be disposed on the other side of the horizontal reflection layer 150 and the reflection optimization layer 130. For example, the upper electrode layer 170 may include metal such as gold (Au), silver (Ag), aluminum (Al), tungsten (W), titanium (Ti), tantalum (Ta), manganese (Mg), and cobalt (Co). The upper electrode layer 170 may connect the central portion 151 of the horizontal reflection layer 150 to the first to fourth ring portions 152, 153, 154, and 155. For example, the upper electrode layer 170 may include a second arc electrode 172 and a second rod electrode 174. The second arc electrode 172 may be disposed on the fourth ring portion 155. The second rod electrode 174 may connect the second arc electrode 172 to the central portion 151.

Figure 5:
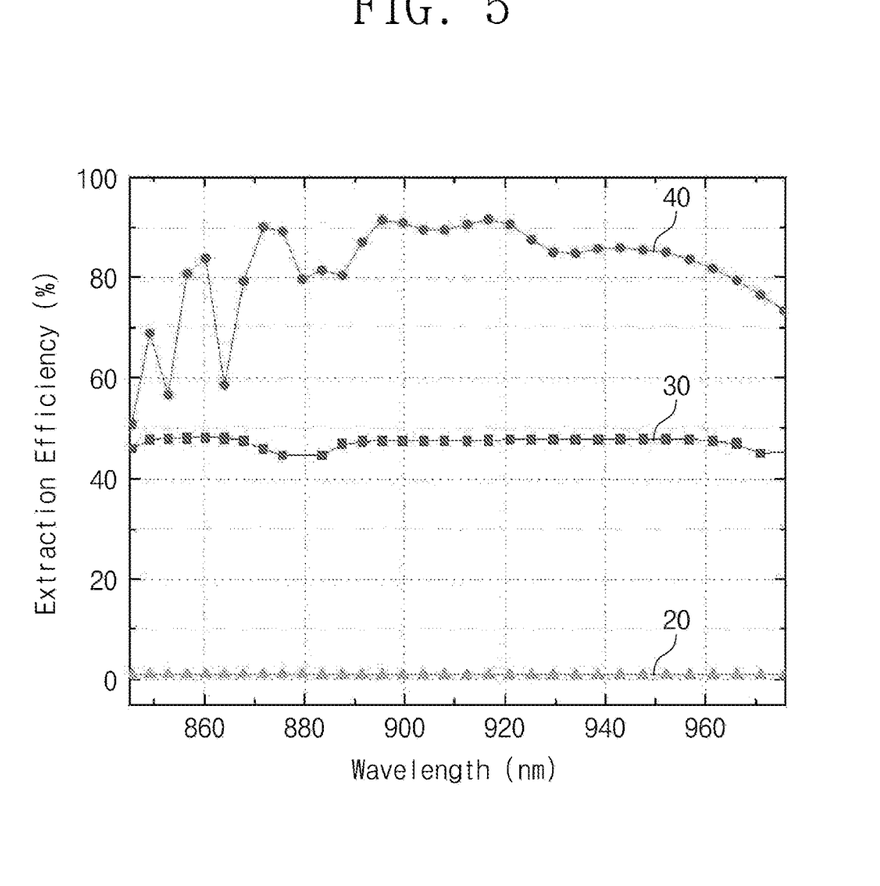
FIG. 5 is a graph showing a first light extraction efficiency of a vertical reflection layer, a second light extraction efficiency of the horizontal reflection layer, and a third light extraction efficiency of the vertical and horizontal reflection layer of FIG. 4.

FIG. 5 is a graph showing a first light extraction efficiency 20 of the vertical reflection layer 120, a second light extraction efficiency 30 of the horizontal reflection layer 150, and a third light extraction efficiency 40 of the vertical and horizontal reflection layer 150 of FIG. 4.

Referring to FIG. 5, the third light extraction efficiency 40 may be greater than each of the first light extraction efficiency 20 and the second light extraction efficiency 30. Each of the first to third light extraction efficiencies 20, 30, and 40 may correspond to a light transmission, a light collection efficiency, or a light extraction efficiency. When the light 400 has a wavelength of about 900 nm, the first light extraction efficiency 20 may be a transmission of about 1%, the second light extraction efficiency 30 may be a transmission of about 48%, and the third light extraction efficiency 40 may be a transmission of about 91%. Thus, the vertical reflection layer 120 and the horizontal reflection layer 150 may increase the light transmission, the light collection efficiency, and the light extraction efficiency.

Figure 6:
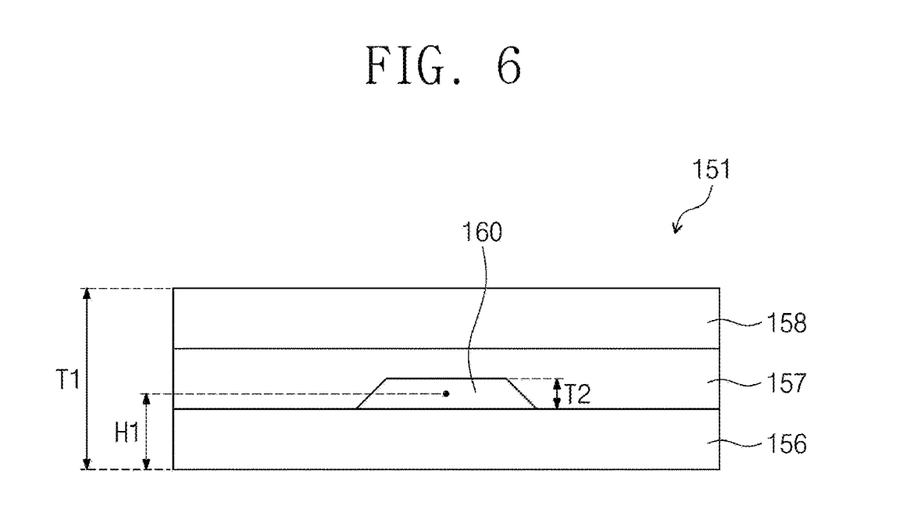
FIG. 6 is a cross-sectional view illustrating an example of the quantum light source and a central portion of the horizontal reflection layer.

FIG. 6 is a view illustrating an example of the quantum light source 160 and the central portion 151 of the horizontal reflection layer 150.

Referring to FIG. 6, the quantum light source 160 may be disposed at a first height H1 in the central portion 151. For example, the first height H1 may be about 50 nm. The first height H1 may be defined as a height and/or a distance from a bottom surface of the first doped layer 156 to a center of the quantum light source 160. The central portion 151 may have a first thickness T1 of about 125 nm. The quantum light source 160 may have a second thickness T2 of about 2 nm to about 10 nm.

Figure 7:
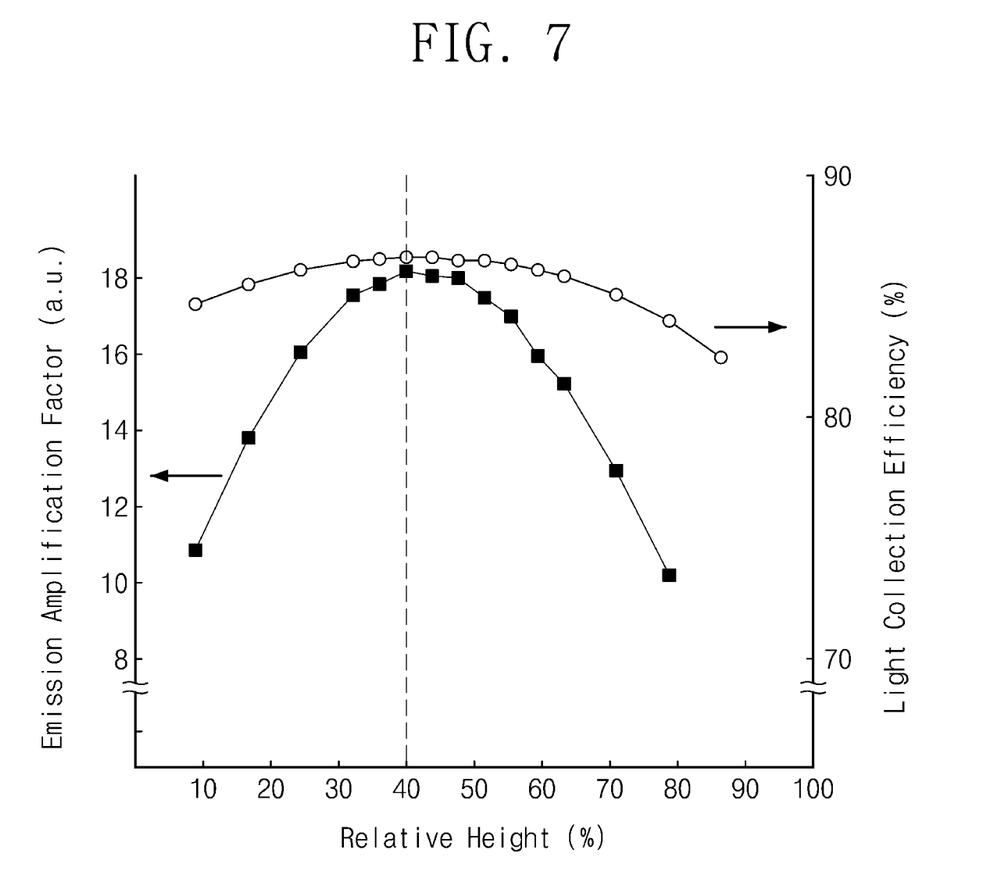
FIG. 7 is a graph showing an emission amplification factor and a light collection efficiency of light according to a relative height of the quantum light source with respect to a first thickness of the central portion of FIG. 6.

FIG. 7 is a graph showing an emission amplification factor and a light collection efficiency of the light 400 according to a relative height of the quantum light source 160 with respect to the first thickness T1 of the central portion 151 of FIG. 6.

Referring to FIG. 7, when the quantum light source 160 has a relative height of about 40% in the central portion 151, each of the emission amplification factor and the light collection efficiency may be maximized. That is, the quantum light source 160 may be disposed at the relative height of about 40% of the first height T1 of the horizontal reflection layer 150. When the first thickness T1 of the central portion 151 of the horizontal reflection layer 150 is about 125 nm, the first height H1 of the quantum light source 160 may be about 50 nm. In other words, the quantum light source 160 disposed at a relative depth of about 60% in the central portion 151 may have the maximum emission amplification factor and the maximum light collection efficiency.

Referring to FIGS. 1 and 2 again, the optical circuit 200 may be disposed between the quantum light source device 100 and the optical fiber 300. For example, the optical circuit 200 may include a circuit board 210 and optical waveguides 220. The circuit board 210 may include glass, quartz, silicon (Si), gallium arsenide (GaAs), indium phosphide (InP), and aluminium oxide ($Al_2O_3$). The optical waveguides 220 may be disposed on the circuit board 210. Each of the optical waveguides 220 may be aligned to the central portion 151 of the horizontal reflection layer 150. The optical waveguides 220 may include an optical coupler or an optical modulator.

The optical fibers 300 may be connected to the optical waveguides 220 of the optical circuit 200. The optical fibers 300 may be arranged with a constant gap by a ferrule 310. The optical fibers 300 may output the light 400 to the outside. Although not shown, each of the optical fibers 300 may include a core and a cladding. The core may transmit the light 400 to the outside. The cladding may surround the core. The cladding may have a refractive index less than that of the core.

A method for manufacturing the optical communication apparatus 10 configured as described above will be described as follows.

Figure 8:
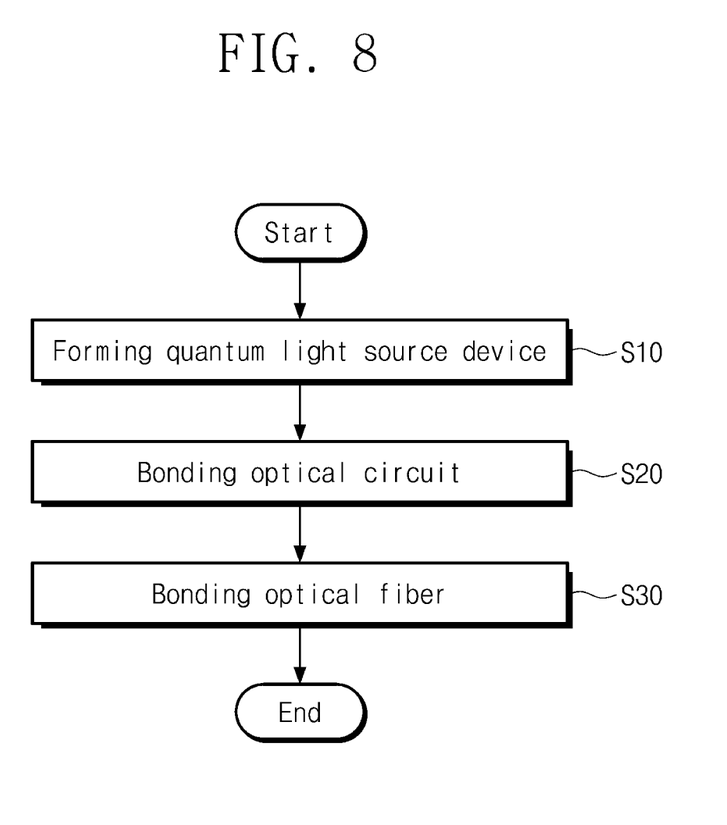
FIG. 8 is a flowchart showing a method for manufacturing an optical communication apparatus according to an embodiment of the inventive concept.

FIG. 8 is a flowchart showing the method for manufacturing an optical communication apparatus 10 according to an embodiment of the inventive concept.

Referring to FIG. 8, a quantum light source device 100 is formed in a process S10. The quantum light source device 100 may be formed through a thin-film deposition process, a photolithography process, an etching process, and a transferring process.

Figure 9:
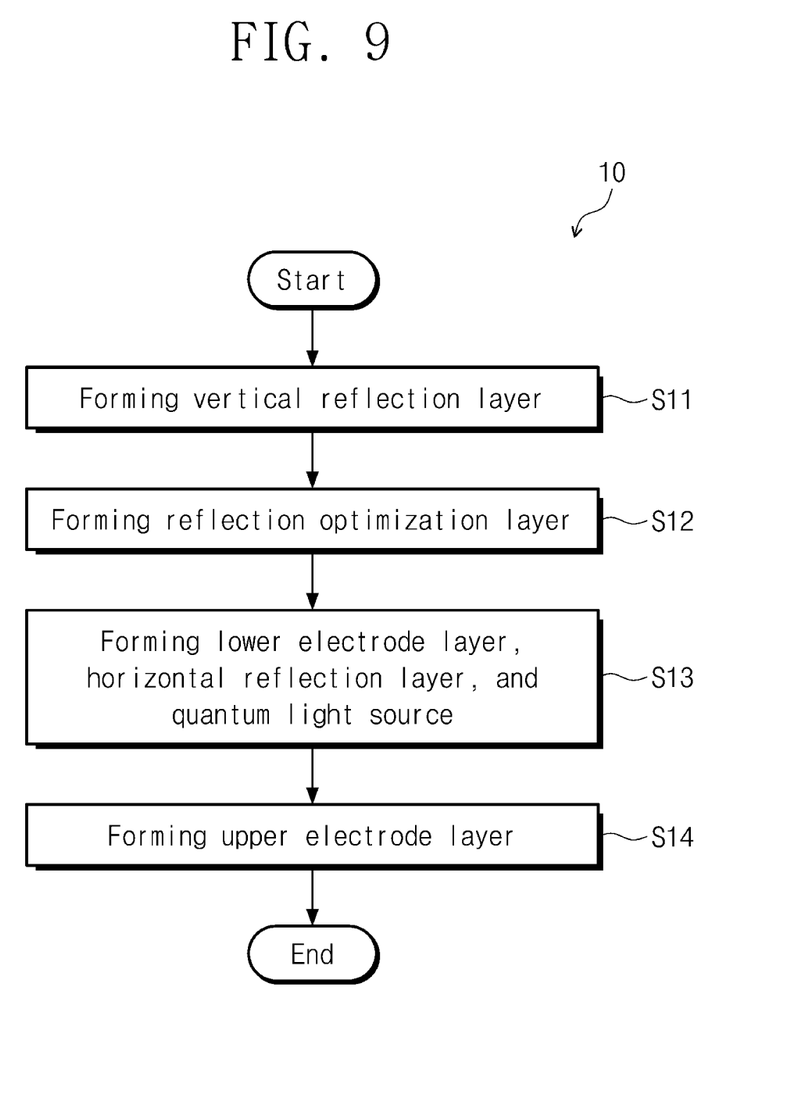
FIG. 9 is a flowchart showing an example of a process of forming the quantum light source device of FIG. 2.

FIG. 9 is a flowchart showing an example of the process S10 of forming the quantum light source device 100. FIGS. 10 to 13 are process cross-sectional views of the quantum light source device 100 of FIG. 2.

Figure 10:
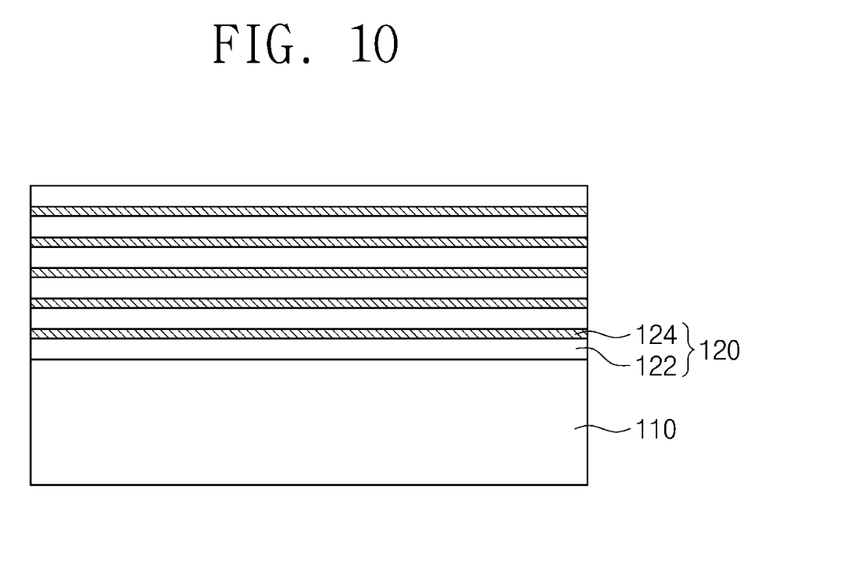
FIGS. 10 to 13 are process cross-sectional views of the quantum light source device of FIG. 2.

Referring to FIGS. 9 and 10, a vertical reflection layer 120 is formed on a light source substrate 110 in a process S11. The vertical reflection layer 120 may include first dielectric layers 122 and second dielectric layers 124. The first dielectric layers 122 and the second dielectric layers 124 may be alternately formed by a chemical vapor deposition method or a physical vapor deposition method.

Figure 11:
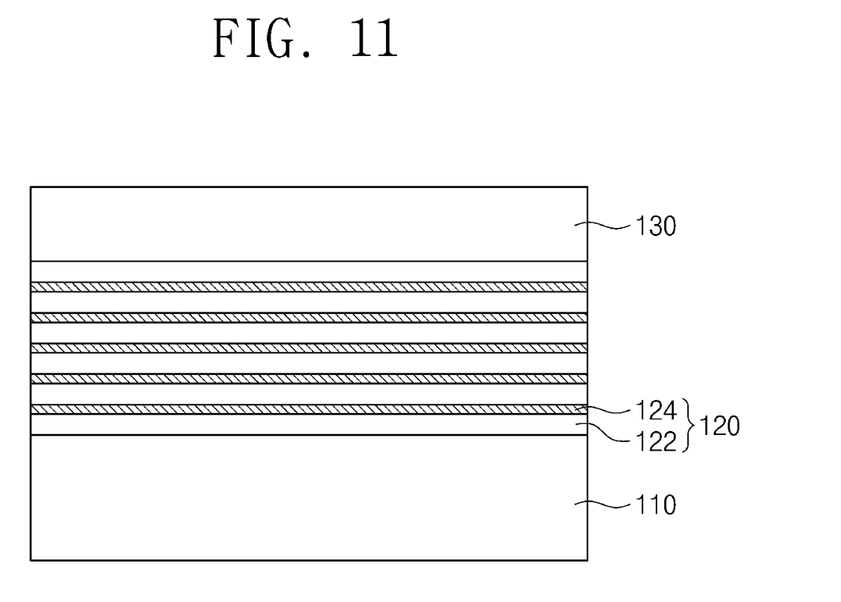

Referring to FIGS. 9 and 11, a reflection optimization layer 130 is formed on the vertical reflection layer 120 in a process S12. The reflection optimization layer 130 may include silicon oxide ($SiO_2$) formed by the chemical vapor deposition method or the physical vapor deposition method.

Referring to FIGS. 3, 4, 9, and 12, a lower electrode layer 140, a horizontal reflection layer 150, and a quantum light source 160 are formed on the reflection optimization layer 130 in a process S13. The lower electrode layer 140, the horizontal reflection layer 150, and the quantum light source 160 may be formed through a transferring method. Although not shown, the lower electrode layer 140, the horizontal reflection layer 150, and the quantum light source 160 may be formed on a dummy substrate (not shown) and then transferred onto the reflection optimization layer 130. The horizontal reflection layer 150 and the quantum light source 160 may be formed on the dummy substrate before the lower electrode layer 140 is formed thereon. The horizontal reflection layer 150 may include a group III-V semiconductor layer of GaAs or InP formed by the chemical vapor deposition method. A second doped layer of the horizontal reflection layer 150 may be formed on the dummy substrate, and an intrinsic layer 157 may be formed on the second doped layer 158. The quantum light source 160 may be formed in the intrinsic layer 157. The quantum light source 160 may include InAs that acts as a defect in the intrinsic layer 157. A first doped layer 156 may be disposed on the intrinsic layer 157. When the horizontal reflection layer 150 has a first thickness T1 of about 125 nm, the quantum light source 160 may be formed at a first height H1 of about 50 nm from a top surface of the first doped layer 156. The lower electrode layer 140 may be formed on the first doped layer 156. The lower electrode layer 140 may be patterned into a first arc electrode 142 and a first rod electrode 144. The first arc electrode 142 may be formed on an edge of the first doped layer 156. The first rod electrode 144 may be connected to the first arc electrode 142 and formed in a direction toward a center of the first doped layer 156. The lower electrode layer 140, the horizontal reflection layer 150, and the quantum light source 160 may be transferred onto the reflection optimization layer 130.

Figure 12:
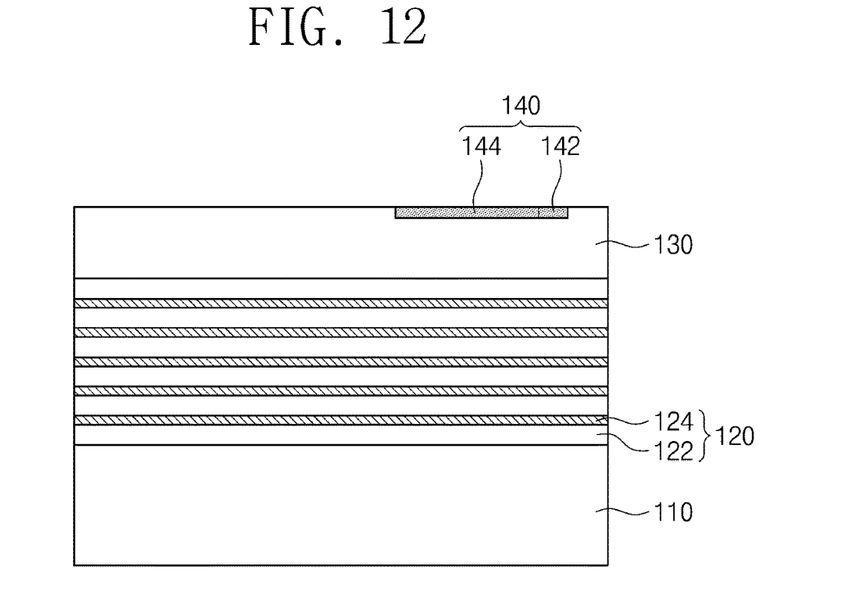
Figure 13:
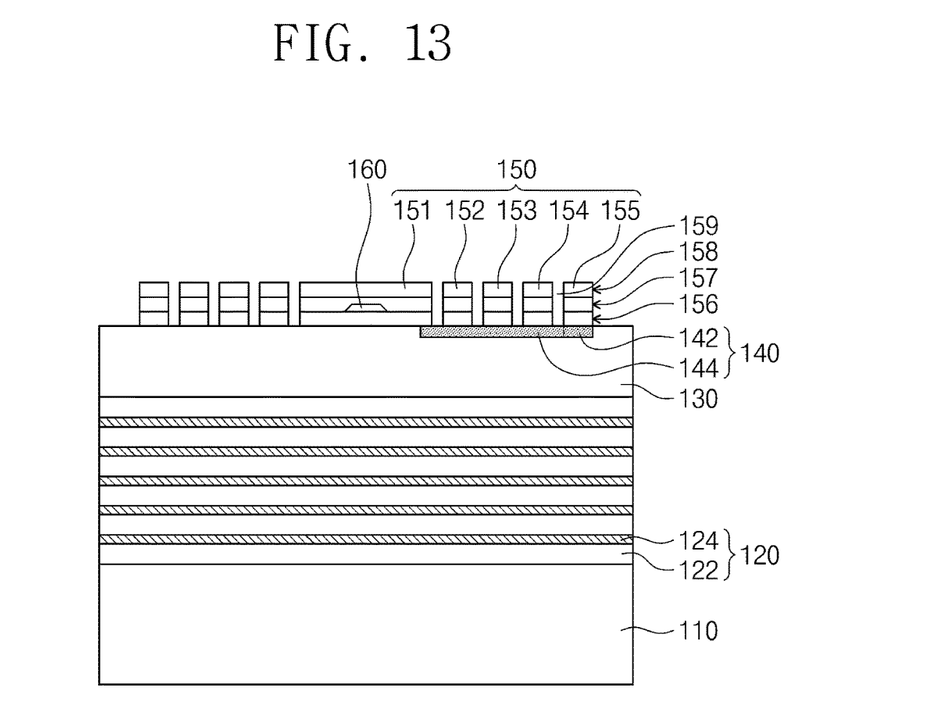

Thereafter, the horizontal reflection layer 150 may be patterned into a central portion 151 and first to fourth ring portions 152, 153, 154, and 155 through a photolithography process and an etching process. The central portion 151 may be formed on a center of the reflection optimization layer 130. The quantum light source 160 may be provided in the central portion 151. The first to fourth ring portions 152, 153, 154, and 155 may be formed outside the central portion 151. The central portion 151 and each of the first to fourth ring portions 152, 153, 154, and 155 may be separated from each other by an air gap 150.

Referring to FIGS. 4 and 9, an upper electrode layer 170 is formed on the central portion 151 of the horizontal reflection layer 150 and one side of each of the first to fourth ring portions 152, 153, 154, and 155 in a process 515. The upper electrode layer 170 may be formed through a metal deposition process, a photolithography process, and an etching process. The upper electrode layer 170 may include a second arc electrode 172 and a second rod electrode 174. The second arc electrode 172 may be disposed on the other side of the fourth ring portion 158. The second rod electrode 174 may connect the second arc electrode 172 to the central portion 151. Alternatively, the lower electrode layer 140, the horizontal reflection layer 150, the quantum light source 160, and the upper electrode layer 170 may be manufactured on the dummy substrate and then transferred onto the reflection optimization layer 130 by using the transferring method.

Referring to FIGS. 2 and 6 again, an optical circuit 200 is bonded to the horizontal reflection layer 150 and the upper electrode layer 170 in a process S20. The optical circuit 200 may include a circuit board 210 and optical waveguides 220. For example, the optical waveguides 220 may be bonded to the horizontal reflection layer 150 and the upper electrode layer 170 by using a butt coupling method.

Thereafter, optical fibers 300 are bonded or attached to the optical waveguides 220 of the optical circuit 200 in a process S30. The optical fibers 300 may be bonded to the optical waveguides 220 by using the butt coupling method.

As described above, the quantum light source device according to the embodiment of the inventive concept may increase the light extraction efficiency by using the vertical reflection layer and the horizontal reflection layer.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Thus, the above-disclosed embodiments are to be considered illustrative and not restrictive.

What is claimed is:

1. A quantum light source device comprising:
   a vertical reflection layer disposed on a substrate;
   a lower electrode layer disposed on the vertical reflection layer;
   a horizontal reflection layer disposed on the lower electrode layer;
   a quantum light source disposed in the horizontal reflection layer; and
   an upper electrode layer disposed on the horizontal reflection layer,
   wherein the horizontal reflection layer comprises:
   a central portion in which the quantum light source is disposed; and
   a plurality of ring portions that surround an outer portion of the central portion.

2. The quantum light source device of claim 1, wherein the plurality of ring portions are spaced apart from the central portion by an air gap.

3. The quantum light source device of claim 1, wherein the quantum light source is disposed at a relative height that is about 40% of a thickness of the horizontal reflection layer.

4. The quantum light source device of claim 3, wherein when the thickness of the horizontal reflection layer is about 125 nm, the quantum light source is disposed at a height of about 50 nm from a bottom surface of the horizontal reflection layer.

5. The quantum light source device of claim 1, wherein the lower electrode layer comprises:
   a first arc electrode disposed at an outermost portion of the ring portions; and
   a first rod electrode connected to the first arc electrode and disposed at one side of the central portion and the ring portions.

6. The quantum light source device of claim 1, wherein the upper electrode layer comprises:
   a second arc electrode disposed at an outermost portion of the ring portions; and
   a second rod electrode connected to the second arc electrode and disposed at the other side of the central portion and the ring portions.

7. The quantum light source device of claim 1, wherein each of the central portion and the plurality of ring portions comprises:
   a first doped layer having a first conductive-type;
   an intrinsic layer disposed on the first doped layer; and
   a second doped layer disposed on the intrinsic layer and having a second conductive-type that is different from the first conductive-type.

8. The quantum light source device of claim 7, wherein the quantum light source is disposed in the intrinsic layer of the central portion.

9. The quantum light source device of claim 1, wherein the horizontal reflection layer comprises gallium arsenide (GaAs) or indium phosphide (InP).

10. The quantum light source device of claim 1, wherein the quantum light source comprises indium arsenide (InAs).

11. The quantum light source device of claim 1, wherein the vertical reflection layer comprises:
   first dielectric layers; and
   second dielectric layers that are laminated alternately with the first dielectric layers.

12. The quantum light source device of claim 1, further comprising a reflection optimization layer disposed between the vertical reflection layer and the horizontal reflection layer.

13. The quantum light source device of claim 12, wherein the reflection optimization layer comprises silicon oxide.

14. An optical communication apparatus comprising:
   a quantum light source device; and
   an optical fiber bonded to the quantum light source device,
   wherein the quantum light source device comprises:
   a vertical reflection layer disposed on a substrate;
   a lower electrode layer disposed on the vertical reflection layer;
   a horizontal reflection layer disposed on the lower electrode layer;
   a quantum light source disposed in a center of the horizontal reflection layer; and
   an upper electrode layer disposed on the horizontal reflection layer,
   wherein the horizontal reflection layer comprises:
   a central portion in which the quantum light source is disposed; and
   a plurality of ring portions that surround an outer portion of the central portion.

15. The optical communication apparatus of claim 14, further comprising an optical circuit comprising an optical waveguide disposed between the optical fiber and the horizontal reflection layer.

16. The optical communication apparatus of claim 14, wherein the optical waveguide is aligned to the central portion.

* * * * *